(12) United States Patent
Guegan et al.

(10) Patent No.: US 9,595,393 B2
(45) Date of Patent: *Mar. 14, 2017

(54) DIELECTRIC-THIN-FILM FORMING COMPOSITION, METHOD OF FORMING DIELECTRIC THIN FILM, AND DIELECTRIC THIN FILM FORMED BY THE METHOD

(75) Inventors: Guillaume Guegan, Tours (FR); Toshiaki Watanabe, Sanda (JP); Nobuyuki Soyama, Kobe (JP); Hideaki Sakurai, Naka-gun (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 359 days.

This patent is subject to a terminal disclaimer.

(21) Appl. No.: 13/220,936

(22) Filed: Aug. 30, 2011

(65) Prior Publication Data

US 2012/0055372 A1 Mar. 8, 2012

(30) Foreign Application Priority Data

Sep. 2, 2010 (EP) .................................... 10305942

(51) Int. Cl.
*H01G 7/06* (2006.01)
*C04B 35/468* (2006.01)
(Continued)

(52) U.S. Cl.
CPC ........... *H01G 7/06* (2013.01); *C04B 35/4682* (2013.01); *C04B 35/47* (2013.01);
(Continued)

(58) Field of Classification Search
CPC .............. C04B 35/4682; C04B 35/47; C04B 2235/3215; C04B 2235/3213; H01L 28/55; H01G 7/06
(Continued)

(56) References Cited

U.S. PATENT DOCUMENTS 5,630,872 A * 5/1997 Ogi et al. ................. 106/287.18
9,018,118 B2 * 4/2015 Watanabe et al. ............ 501/137
(Continued)

FOREIGN PATENT DOCUMENTS

CN 1526172 A 9/2004
CN 102046563 A 5/2011
(Continued)

OTHER PUBLICATIONS

Tae Gon Ha et al., "Cu-Doping Effects on the Dielectric and Insulating Properties of Sol-Gel Derived $Ba_{0.7}Sr_{0.3}TiO_3$ Thin Films," Journal of the Korean Physical Society, vol. 49, Dec. 2006, pp. S571-S574.

(Continued)

*Primary Examiner* — Jun Li
(74) *Attorney, Agent, or Firm* — Locke Lord LLP (57) ABSTRACT

A dielectric-thin-film forming composition for forming a BST dielectric thin film, includes a liquid composition for forming a thin film which takes a form of a mixed composite metal oxide in which a composite oxide B including Cu (copper) is mixed into a composite metal oxide A expressed by a formula: $Ba_{1-x}Sr_xTi_yO_3$ (wherein $0.2 < x < 0.6$ and $0.9 < y < 1.1$), the liquid composition is an organic metal compound solution in which a raw material for composing the composite metal oxide A and a raw material for composing the composite oxide B are dissolved in an organic solvent at a proportion having a metal atom ratio expressed by the formula shown above and a molar ratio between A and B in the range of $0.001 \leq B/A < 0.15$.

10 Claims, 1 Drawing Sheet (51) Int. Cl.
  *C04B 35/47* (2006.01)
  *C04B 35/622* (2006.01)
  *H01L 49/02* (2006.01)

(52) U.S. Cl.
  CPC ..... *C04B 35/62218* (2013.01); *C04B 2235/3213* (2013.01); *C04B 2235/3215* (2013.01); *C04B 2235/3232* (2013.01); *H01L 28/55* (2013.01)

(58) Field of Classification Search
  USPC .................. 106/287.19; 501/134, 135, 136
  See application file for complete search history.

(56) References Cited

U.S. PATENT DOCUMENTS

| | | | |
|---|---|---|---|
| 2003/0124251 A1 | 7/2003 | Onozawa et al. | |
| 2004/0040494 A1* | 3/2004 | Vaartstra | C23C 16/409 117/104 |
| 2004/0066250 A1 | 4/2004 | Hunt et al. | |
| 2006/0287188 A1 | 12/2006 | Borland et al. | |
| 2008/0072792 A1* | 3/2008 | Yanagisawa et al. | 106/287.19 |
| 2009/0022971 A1* | 1/2009 | Cole | C23C 18/1208 428/220 |
| 2009/0297804 A1* | 12/2009 | Paul et al. | 428/210 |
| 2010/0204034 A1 | 8/2010 | Umeda et al. | |

FOREIGN PATENT DOCUMENTS

| | | |
|---|---|---|
| CN | 102173795 A | 9/2011 |
| JP | 60-236404 A | 11/1985 |
| JP | 01-305855 A | 12/1989 |
| JP | 02-197108 A | 8/1990 |
| JP | 05-116454 A | 5/1993 |
| JP | 08-225950 A | 9/1996 |
| JP | 09-246496 A | 9/1997 |
| JP | 11-260667 A | 9/1999 |
| JP | 2001-139329 A | 5/2001 |
| JP | 2007-042692 A | 2/2007 |
| JP | 2008-028381 A | 2/2008 |
| JP | 2008-053563 A | 3/2008 |
| JP | 2008-235088 A | 10/2008 |
| JP | 2009-177171 A | 8/2009 |
| JP | 4420232 B2 | 2/2010 |
| TW | 570997 B | 1/2004 |
| TW | 200938599 A | 9/2009 |

OTHER PUBLICATIONS

European Search Report dated Mar. 16, 2011, issued for the European Patent Application No. 10305942.4.
Search Report dated May 25, 2012, issued for the European patent application No. 11306708.6.
First Office Action dated Feb. 28, 2015, issued for the Chinese patent application No. 201110258192.2 and English translation thereof.
Office Action mailed Nov. 18, 2014, issued for the Japanese patent application No. 2011-158537 and English translation thereof.
Office Action mailed Dec. 17, 2015, issued for the Chinese patent application No. 201210552098.2 and English translation of Search Report.
Office Action mailed Jan. 25, 2016, issued for the Taiwanese patent application No. 101148086 and English translation thereof.

* cited by examiner

DIELECTRIC-THIN-FILM FORMING COMPOSITION, METHOD OF FORMING DIELECTRIC THIN FILM, AND DIELECTRIC THIN FILM FORMED BY THE METHOD

BACKGROUND OF THE INVENTION

Field of the Invention

The present invention relates to a dielectric-thin-film forming composition, which can form a thin-film capacitor or the like having excellent leak current characteristics, high tunability, and a high dielectric constant; a method of forming a dielectric thin film; and a dielectric thin film formed by the method. In this specification, the term "tunable" means that when an applied voltage is changed, the capacitance is changed. The term "tunability" means the variability or the rate of change of the capacitance.

Description of Related Art

In a high-frequency tunable device such as a high-frequency filter, a high-frequency antenna or a phase shifter or the like, a variable capacity element (tunable element) including an upper electrode, a lower electrode and a thin-film capacitor composed of a dielectric layer formed between the electrodes, is installed. The thin-film capacitor functions as a capacitor in which the capacitance is changed by a change in a voltage which is applied between the electrodes. As the dielectric layer of the thin-film capacitor as described above, a dielectric thin film formed by using a perovskite-type oxide such as strontium titanate ($SrTiO_3$), barium strontium titanate (hereinafter, referred to as "BST"), barium titanate ($BaTiO_3$) or the like, having a high dielectric constant has been used. As a method of forming a dielectric thin film, a chemical solution method such as a sol-gel method has been used in addition to a physical vapor-phase growth method such as a vacuum deposition method, a sputtering method, or a laser ablation method or a chemical vapor-phase growth method such as a chemical vapor deposition (CVD) method (for example, see Japanese Unexamined Patent Application First Publication No. S 60-236404).

Figure 1:
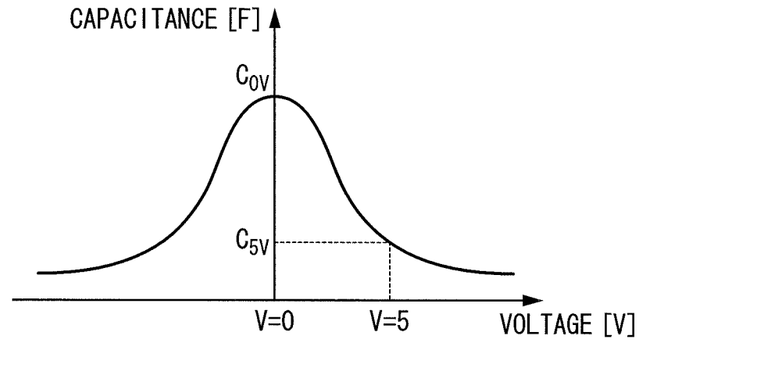
FIG. 1 is an explanatory diagram illustrating a variation in an capacitance, which accompanies a variation in an applied voltage, in a variable capacitive element.

The thin-film capacitor installed in the high-frequency tunable device is required to have variability (tunability) in its capacitance with respect to an applied voltage. Accordingly, it is desirable that the range of variation of the capacitance that can be controlled when the voltage is applied is increased, that is, it is desirable for the thin-film capacitor to have high tunability. The reason is that as the tunability increases, a wider resonant frequency band can be handled with a smaller voltage change. In greater detail, the tunability is expressed by the formula $(C_{0V}-C_{tV})/C_{0V}\times100\%$ where the capacitance before the application of a voltage is denoted by $C_{0V}$ and the capacitance after the application of a voltage of t V is denoted by $C_{tV}$. For example, as shown in FIG. 1, when a voltage of 5 V is applied, the capacitance is changed from $C_{0V}$, when no voltages are applied to $C_{5V}$. At this time, it can be said that the greater the variation from $C_{0V}$ to $C_{5V}$ is, the higher the tunability, and that a thin-film capacitor having high tunability is achieved. As a technique for increasing the tunability, a tunable capacitor has been disclosed which maintains a desired impedance when used in a high-frequency band and can secure high tunability by using a material having a high dielectric constant (for example, see Japanese Unexamined Patent Application First Publication No. 2008-53563).

SUMMARY OF THE INVENTION

However, according to the conventional technique disclosed in the above JP-2008-53563, it is necessary to perform a complicated step for forming a second dielectric layer whose dielectric constant is lower than that of a first dielectric layer so as to cover a part of the main surface of the first dielectric layer, when the dielectric layer is formed.

The inventors of the present invention have focused their attention on the material used in forming a dielectric thin film, and from the point of view of an improvement to the material, the present invention has been achieved which can exhibit high tunability and improve the dielectric constant and leak current characteristics as basic characteristics of a thin-film capacitor or the like.

An object of the present invention is to provide a dielectric-thin-film forming composition, which can enhance leak current characteristics, tunability, and the dielectric constant when used in a thin-film capacitor or the like, a method of forming a dielectric thin film, and a dielectric thin film.

[1] A dielectric-thin-film forming composition for forming a BST dielectric thin film includes a liquid composition for forming a thin film which takes a form of a mixed composite metal oxide in which a composite oxide B including Cu (copper) is mixed into a composite metal oxide A expressed by a formula: $Ba_{1-x}Sr_xTi_yO_3$ (wherein $0.2<x<0.6$ and $0.9<y<1.1$), wherein the liquid composition being an organic metal compound solution in which a raw material for composing the composite metal oxide A and a raw material for composing the composite oxide B are dissolved in an organic solvent at a proportion having a metal atom ratio expressed by the formula shown above and a molar ratio between A and B in the range of $0.001\leq B/A<0.15$.

[2] The dielectric-thin-film forming composition according to [1] above, wherein the raw material for the composite metal oxide A is a compound in which an organic group is bonded with a metal element via an oxygen atom or a nitrogen atom thereof.

[3] The dielectric-thin-film forming composition according to [2] above, wherein the raw material for composing the composite metal oxide A is at least one compound selected from a group including a metal alkoxide, a metal diol complex, a metal triol complex, a metal carboxylate, a metal β-diketonate complex, a metal β-diketo ester complex, a metal β-iminoketo complex, and a metal amino complex.

[4] The dielectric-thin-film forming composition according to [1] above, wherein raw material for the composite oxide B is a compound in which an organic group is bonded with Cu (copper) via an oxygen atom or a nitrogen atom thereof.

[5] The dielectric-thin-film forming composition according to [4] above, wherein the raw material for the composite oxide B is at least one compound selected from a group including a carboxylate compound, a nitrate compound, a alkoxide compound, a diol compound, a triol compound, a β-diketonate compound, a β-diketo ester compound, a β-iminoketo compound, and an amino compound.

[6] The dielectric-thin-film forming composition according to [5] above, wherein the carboxylate compound is at least one compound selected from a group including copper naphthenate, copper n-octanoate, copper 2-ethylhexanoate, copper n-heptanoate, copper n-hexanoate, copper 2-ethylbutyrate, copper n-valerate, copper i-valerate, copper n-butyrate, copper i-butyrate, and copper propionate.

[7] The dielectric-thin-film forming composition according to [5] above, wherein the nitrate compound is a copper nitrate.

[8] The dielectric-thin-film forming composition according to any one of [1] to [7] above, further includes at least one stabilizer selected from a group including a β-diketone, a β-ketone acid, a β-ketoester, a oxyacid, a diol, a triol, a higher carboxylate, a alkanolamine, and a polyvalent amine at a ratio of 0.2 to 3 mol with respect to 1 mol of the total amount of the metal in the composition.

[9] The dielectric-thin-film forming composition according to any one of [1] to [8] above, wherein the molar ratio B/A between B and A is in the range of $0.002 \leq B/A \leq 0.1$.

[10] A method of forming a dielectric thin film, includes the steps of: repeating a process for coating a heat-resistant substrate with the dielectric-thin-film forming composition according to any one of [1] to [9] above and drying it, until a film with a desirable thickness is obtained; and baking, after the above process, the film at its crystallization temperature or higher in the air, the oxygen atmosphere, or the water vapor atmosphere.

[11] A BST dielectric thin film formed by the method according to [10] above, wherein the BST dielectric thin film includes Cu.

[12] The BST dielectric thin film according to [11] above, wherein in a thin-film capacitor formed by using the BST dielectric thin film which has a thickness in the range of 100 nm to 500 nm, the leakage current density is less than or equal to $3.0 \times 10^{-6}$ A/cm$^2$ and the tunability is more than or equal to 70% at a voltage of 20 V, and the dielectric constant is more than or equal to 300 at a voltage of 0 V.

[13] A composite electronic part of a thin-film capacitor, a capacitor, an IPD (Integrated Passive Device), a DRAM memory capacitor, a multilayer capacitor, a gate insulating material for a transistor, a nonvolatile memory, a pyroelectric infrared detection element, a piezoelectric device, an electro-optical device an actuator, a resonator, an ultrasonic motor, or an LC noise filter element, which has the BST dielectric thin film according to [12] above.

[14] The composite electronic parts of a thin-film capacitor, a capacitor, an IPD, a DRAM memory capacitor, a multilayer capacitor, a gate insulating material for a transistor, a nonvolatile memory, a pyroelectric type infrared detection element, a piezoelectric device, an electro-optic device, an actuator, a resonator, an ultrasonic motor, or an LC noise filter element according to [13] above, wherein the BST dielectric thin film responds to a frequency band of not less than 100 MHz.

In the present invention, the dielectric-thin-film forming composition for forming a BST dielectric thin film includes a liquid composition for forming a thin film which takes the form of a mixed composite metal oxide in which a composite oxide B including Cu (copper) is mixed into a composite metal oxide A expressed by a formula: $Ba_{1-x}Sr_xTi_yO_3$ (wherein $0.2<x<0.6$ and $0.9<y<1.1$), wherein the liquid composition is an organic metal compound solution in which a raw material for composing the composite metal oxide A and a raw material for composing the composite oxide B are dissolved in an organic solvent at a proportion of giving a metal atom ratio expressed by the formula shown above and at a molar ratio between A and B in the range of $0.001 \leq B/A < 0.15$. Therefore, a thin film capacitor provide with the above dielectric-thin-film formed by using the above composition exhibits a low leak current density and a high tunability.

DETAILED DESCRIPTION OF THE INVENTION

Next, a preferred embodiment of the present invention will be described with reference to the accompanying drawing.

A dielectric-thin-film forming composition of the present invention is a composition for forming a BST dielectric thin film. A dielectric thin film which is formed by using the composition employs a form of a mixed composite metal oxide obtained by mixing a composite oxide B including Cu (copper) into a composite metal oxide A which is expressed by the formula $Ba_{1-x}Sr_xTi_yO_3$ (where $0.2<x<0.6$, $0.9<y<1.1$). This composition includes an organic metal compound solution in which a raw material for composing the composite metal oxide A and a raw material for composing the composite oxide B are dissolved at a ratio so as to meet the metal atomic ratio expressed by the above formula.

That is, the composition of the present invention is prepared by adding the raw material for the composite oxide B including Cu (copper). By providing a dielectric thin film formed by using the composition, a thin-film capacitor or the like having high leak current characteristics, high tunability and a high dielectric constant can be produced. It is assumed that the technical reason for a decrease in a leak current density by the addition of the raw material Cu (copper) is that the film is densified due to the addition of Cu (copper). In addition, it is assumed that the reason for the exhibition of high tunability is that crystal grains in the film are made large due to the addition of Cu (copper) and thus the dielectric constant is improved.

A preferable compound as a raw material for the combined metal oxide A is the one in which an organic group is bound to the respective metallic elements of Ba, Sr, and Ti via an oxygen atom or a nitrogen atom thereof. For example, it is possible to exemplify at least one compound selected from a group constituted by metal alkoxide, a metal-diol complex, a metal-triol complex, a metal carboxylate, a metal β-diketonate complex, a metal β-diketo esters complex, a metal β-iminoketo complex, and a metal amino complex. The compounds which can be particularly preferably used are a metal alkoxide, a partial hydrolysate thereof, and an organic acid salt.

Specifically, it is possible to exemplify, as a Ba compound, a carboxylate salt such as barium 2-ethylbutyrate, barium 2-ethylhexanoate, barium acetate, or the like; or a metal alkoxide such as barium diisopropoxide, barium dibutoxide, or the like. In addition, it is possible to exemplify, as an Sr compound, a carboxylate salt such as strontium 2-ethylbutyrate, strontium 2-ethylhexanoate, strontium acetate, or the like; or a metal alkoxide such as strontium diisopropoxide, strontium dibutoxide, or the like. Furthermore, it is possible to exemplify, as a Ti compound, a metal alkoxide such as titanium tetraethoxide, titanium tetraisopropoxide, titanium tetrabutoxide, titanium dimethoxy-diisopropoxide, or the like. The metal alkoxide may be used as it is. Alternatively, the partial hydrolysate thereof may be used in order to promote the hydrolysis.

A preferable compound as a raw material for the combined metal oxide B is the one in which an organic group is bound to a Cu (copper) element via an oxygen atom or a nitrogen atom thereof. For example, it is possible to exemplify at least one compound selected from a group constituted by a carboxylate compound, a nitrate compound, an alkoxide compound, a diol compound, a triol compound, a β-diketonate compound, a β-diketo esters compound, a β-iminoketo compound, and an amino compound. The compounds which can be particularly preferably used are a carboxylate compound such as copper naphthenate, copper n-octanoate, copper 2-ethylhexanoate, copper n-heptanoate, copper n-hexanoate, copper 2-ethylbutyrate, copper n-valerate, copper i-valerate, copper n-butyrate, copper i-butyrate, copper propionate or the like; and a nitrate compound such as copper nitrate, or the like. However, the dielectric-thin-film forming composition, which is obtained using copper acetate as the raw material from among carboxylate compounds, is not preferable since it may easily cause precipitation and has a problem with its preservation stability.

In order to prepare the dielectric-thin-film forming composition according to the present invention, these raw materials are dissolved into an appropriate solvent at a ratio corresponding to a desirable composition for the dielectric thin film, and then prepared at a suitable concentration for the coating. A molar ratio B/A between B and A in the dielectric thin film after the formation is adjusted so as to be in the range of $0.001 \leq B/A < 0.15$. As a result of preparing it in such a manner, it is possible to allow the dielectric thin film after formation using this composition to exhibit its low leak density and high tunability. In addition, if the molar ratio exceeds the upper limit value, the tunability may be undesirably deteriorated. It is particularly preferable that the molar ratio is in the range of $0.002 \leq B/A \leq 0.1$.

The solvent used here for the dielectric-thin-film forming composition is appropriately determined depending upon the raw material to be used. Those available as the solvent generally include calboxylic acid, alcohol, ester, ketones (for example, acetone and methyl ethyl ketone), ethers (for example, dimethyl ether and diethyl ether), cycloalkanes (for example, cyclohexane and cyclohexanol), aromatic compound (for example, benzene, toluene, and xylene), tetrahydrofuran, and a solvent obtained by mixing two or more types of these.

Specifically, it is preferable to use, as a calboxylic acid, n-butyric acid, α-methylbutyrate, i-valeric acid, 2-ethyl butyrate, 2,2-dimethyl butyrate, 3,3-dimethyl butyrate, 2,3-dimethyl butyrate, 3-methylpentane acid, 4-methylpentane acid, 2-ethylpentane acid, 3-ethylpentane acid, 2,2-dimethylpentane acid, 3,3-dimethylpentane acid, 2,3-dimethylpentane acid, 2 ethylhexanoic acid, and 3-ethylhexanoic acid.

It is preferable to use, as an ester, ethyl acetate, propyl acetate, n-butyl acetate, sec-butyl acetate, tert-butyl acetate, isobutyl acetate, n-amyl acetate, sec-amyl acetate, tert-amyl acetate, and isoamyl acetate. In addition, it is preferable to use, as alcohol, 1-propanol, 2-propanol, 1-butanol, 2-butanol, iso-butyl alcohol, 1-pentanol, 2-pentanol, 2-methyl-2-pentanol, and 2-methoxyethanol.

It is preferable that the total concentration of the organic metal compounds in the organic metal compound solution for the dielectric-thin-film forming composition is in the range of about 0.1 to 20 percent by mass of a reduced quantity of the metal oxide. If the total concentration of the organic metal compounds is less than above lower limit, it is difficult to form the dielectric thin film which has a desired film thickness, since the film thickness par a single coating becomes thin. In contrast, if the total concentration of the organic metal compounds is more than above upper limit, cracks are generated on the dielectric thin film after baking. Therefore, it is undesirable to be out side of the above range of the total concentration of the organic metal compounds.

It is possible to add a stabilizing agent of about 0.2 to 3 at a ratio of (the number of molecules in the stabilizing agent)/(the number of metal atoms) into the organic metal compound solution, if necessary. The stabilizing agent is at least one compound selected from a group including β-diketones (for example, acetylacetone, heptafluoro buthanoyl pivaloyl methane, dipivaloyl methane, trifluoro acetylacetone, benzoylacetone, and the like), β-ketonic acids (for example, acetoacetic acid, propionylacetic acid, benzoylacetic acid, and the like), β-ketoesters (for example, lower alkyl esters such as methyl, propyl, buthyl, and the like of the ketonic acids above), oxy acids (for example, lactic acid, glycolic acid, α-oxybutyrate, salicylic acid, and the like), lower alkyl esters and oxy ketones of the oxyacids above (for example, diacetone alcohol, acetoin, and the like), a diol, a triol, a higher carboxylic acid, alkanolamines (for example, diethanolamine, triethanolamine, and monoethanolamine), a polyvalent amine, and the like.

In the present invention, some particles are removed through a filtering process of the organic metal compound solution prepared above, and the number of other particles with a diameter of 0.5 μm or larger (particularly, 0.3 μm or larger, and more particularly, 0.2 μm or larger is preferably 50 particles/mL or fewer per 1 mL of the solution.

In addition, a light-scattering particle counter is used for measuring the number of particles in the organic metal compound solution.

If the number of particles with a diameter of 0.5 μm or larger in the organic metal compound solution exceeds 50 particles/mL, long-term preservation stability deteriorates. The stability is preferable as the number of particles with a diameter of 0.5 μm or larger in the organic metal compound solution becomes small, and particularly preferable when the number of particles is 30 particles/mL or fewer.

A method for processing the organic metal compound solution after the preparation so as to obtain the number of particles described above is not limited, but for example, a method below can be exemplified. As a first method, there is a filtering method in which a membrane filter with a pore diameter of 0.2 μm available in the market is used to perform pumping with a syringe. As a second method, there is a pressure filtering method in which a membrane filter with a pore diameter of 0.05 μm available in the market and a pressure tank are combined. As a third method, there is a circulation filtering method in which the filter used in the second method and a solution circulating tank are combined.

In any method as described above, the particle capture rate of the filter differs depending on the pressure of the pressure-fed solution. It has been known that the lower the pressure is, the higher the capture rate becomes. In particular, it is preferable to allow the solution to slowly pass through the filter under a low pressure, in order to satisfy the condition of keeping the number of the particles, each of which has a diameter of not less than 0.5 μm, to not more than 50 in the first and second methods.

It is possible to readily form the dielectric thin film in the form of the mixed combined metal oxides, which is obtained by mixing the combined metal oxide B including Cu (copper) into the BST combined metal oxide A, by using the dielectric-thin-film forming composition according to the present invention. The molar ratio B/A between B and A in the thin film which is formed using this composition is in the range of $0.001 \leq B/A < 0.15$. When the molar ratio B/A between B and A is in this range, it is possible to lower the leak current density and allow the thin-film capacitor or the like provided with this thin film to exhibit high tunability and a high dielectric constant. In addition, when the molar ratio exceeds its upper limit value, tunability may be deteriorated. It is particularly preferable that the molar ratio is in the range of $0.002 \leq B/A \leq 0.1$ from among the above ratio.

When the dielectric thin film is formed using the dielectric-thin-film forming composition according to the present invention, the above composition is coated on a heat-resistant substrate by a coating method such as a spin coating, a dip coating, an LSMCD (Liquid Source Misted Chemical Deposition), or the like, and then subjected to a drying treatment (pre-baking) and a main baking.

The specific example for the heat-resistant substrate to be used includes a substrate which employs for the substrate surface layer, a perovskite type conductive oxide such as single-crystal Si, poly-crystal Si, Pt, Pt (for the uppermost layer)/Ti, Pt (for the uppermost layer)/Ta, Ru, $RuO_2$, Ru (for the uppermost layer)/$RuO_2$, $RuO_2$ (for the uppermost layer)/Ru, Ir, $IrO_2$, Ir (for the uppermost layer)/$IrO_2$, Pt (for the uppermost layer)/Ir, Pt (for the uppermost layer)/$IrO_2$, $SrRuO_3$, $(La_xSr_{(1-x)})CoO_3$ or the like. However, the heat-resistant substrate to be used here is not limited thereto.

When a desirable film thickness is not obtained with a single coating, the main baking is performed after the coating process and the drying process are performed a plurality of times. Here, the word "desirable film thickness" means the thickness of the dielectric thin film to be obtained after the main baking. In the case of using the dielectric thin film for a thin-film capacitor with a high-capacitance density, the thickness of the dielectric thin film after the main baking is in the range of 50 to 500 nm.

The pre-baking is performed to remove the solvent and to pyrolyze or hydrolyze the organic metal compound and the organic compound to convert them into the combined oxides. Accordingly, the pre-baking is performed in air, in an oxidizing atmosphere, or in a water-vapor atmosphere. Even in the case of heating in the air, it is possible to sufficiently secure the moisture required for hydrolysis by the humidity in the air. This heating treatment may be performed in a two-step manner including a low-temperature heating for removing the solvent and a high-temperature heating for pyrolyzing the organic metal compound and the organic compound.

The main baking is the process for baking the thin film, which is obtained by the pre-baking, at its crystallization temperature or higher to make it crystallize, and the dielectric thin film can be obtained by this process. It is preferable to use $O_2$, $N_2$, Ar, $N_2O$, $H_2$, or the gas obtained by mixing some of these for the baking atmosphere for this crystallization process.

The pre-baking is performed at 150 to 550° C. for 1 to 30 minutes while the main baking is performed at 450 to 800° C. for 1 to 60 minutes. The main baking may be performed by a rapid thermal annealing (RTA processing). In the case of performing the main baking by the RTA processing, it is preferable that the rate of temperature increase is set in the range of 10 to 100° C./second.

The dielectric thin film of the present invention, formed in this manner, can decrease a leak current density and exhibit high tunability and a high dielectric constant in a thin-film capacitor or the like provided with the above thin film. In addition, the dielectric thin film of the present invention has excellent basic characteristics as an IPD. Specifically, when a thin-film capacitor is formed by using the dielectric thin film (the BST dielectric thin film) which has a thickness in the range of 100 nm to 500 nm, a leakage current density of less than or equal to $3.0 \times 10^{-6}$ $A/cm^2$ and a tunability of more than or equal to 70% are exhibited at a voltage of the thin-film capacitor of 20 V. Furthermore, a dielectric constant of more than or equal to 300 is exhibited at a thin-film capacitor voltage of 0 V.

Therefore, the dielectric thin film according to the present invention can be used as a constituent material for composite electronic parts of a thin-film capacitor, a capacitor, an IPD, a DRAM memory capacitor, a multilayer capacitor, a gate insulator for a transistor, a nonvolatile memory, a pyroelectric type infrared detecting element, a piezoelectric element, an electro-optic element, an actuator, a resonator, an ultrasonic motor, or an LC noise filter element. The dielectric thin film according to the present invention may be used particularly for the ones among these which can respond to a frequency band of not less than 100 MHz.

EXAMPLES

Examples according to the present invention will be described in detail along with Comparative Examples.

The followings are the raw materials used in the Examples and Comparative Examples.

Ba compound: barium 2-ethylbutyrate
Sr compound: strontium 2-ethylbutyrate
Ti compound: titanium tetraisopropoxide
Cu compound: copper naphthenate, copper 2-ethyl butyrate, copper n-octanoate, copper 2-ethylhexanoate, copper n-valerate, copper i-valerate, copper n-butyrate, copper i-butyrate, copper propionate, copper acetate, and copper nitrate

Example 1

A sufficiently dehydrated isoamyl acetate was used as an organic solvent, and barium 2-ethylbutyrate and strontium 2-ethylbutyrate were dissolved thereto as the Ba compound and the Sr compound such that the molar ratio of Ba:Sr became 70:30. Thereafter, titanium tetraisopropoxide was added to the resulting solution as the Ti compound such that the molar ratio of Ba:Sr:Ti became 70:30:100. Moreover, copper naphthenate was added and dissolved as the Cu compound such that the molar ratio B/A between B and A becomes 0.02. Furthermore, a stabilizer (an acetylacetone) was added at a ratio which was one time the total metal amount so as to stabilize the solution, and the thin film forming composition with a reduced quantity of the metal oxide of 7% by mass was prepared.

The formation of the thin film was performed by the following CSD method (chemical solution deposition method).

That is, at first, a 6-inch silicon substrate with a Pt lower electrode film formed thereon by the sputtering method was prepared as a substrate. The thin film forming composition prepared in the above manner was coated on the Pt lower electrode film of this substrate by a spin coat method under the condition at 500 rpm for 3 seconds, and thereafter, under the condition at 2000 rpm for 15 seconds.

Then, the drying treatment and the pre-baking were performed using a hot plate by heating it at 350° C. for 10 minutes. The coating process and the pre-baking process were repeated four times, and the resultant was subjected to a baking process for 1 hour in an air atmosphere under conditions of a temperature increase rate of 5° C./minute, and a temperature of 700° C., thereby obtaining the dielectric thin film with the film thickness of 350 nm.

Thereafter, the thin-film capacitor was obtained by using a metal mask and producing a Pt upper electrode with a square of about 250 μm×250 μm on its surface in a sputtering method.

Example 2

As shown in the following table 1, the thin-film capacitor was obtained by preparing the thin-film forming composition in the same manner as in the Example 1 except that a copper naphthenate was added such that the molar ratio B/A between B and A became 0.03.

Example 3

As shown in the following table 1, the thin-film capacitor was obtained by preparing the thin-film forming composition in the same manner as in the Example 1 except that a copper naphthenate was added such that the molar ratio B/A between B and A became 0.05.

Example 4

As shown in the following table 1, the thin-film capacitor was obtained by preparing the thin-film forming composition in the same manner as in the Example 1 except that copper naphthenate was added such that the molar ratio B/A between B and A became 0.10.

Example 5

As shown in the following table 1, the thin-film capacitor was obtained by preparing the thin-film forming composition in the same manner as in the Example 1 except that diethanolamine was added as the stabilizer instead of acetylacetone.

Example 6

As shown in the following table 1, the thin-film capacitor was obtained by preparing the thin-film forming composition in the same manner as in the Example 1 except that triethanolamine was added as the stabilizer instead of acetylacetone.

Example 7

As shown in the following table 1, the thin-film capacitor was obtained by preparing the thin-film forming composition in the same manner as in the Example 1 except that formamide was added as the stabilizer instead of acetylacetone.

Example 8

As shown in the following table 1, the thin-film capacitor was obtained by preparing the thin-film forming composition in the same manner as in the Example 1 except that 1-amino-2-propanol was added as the stabilizer instead of acetylacetone.

Example 9

As shown in the following table 1, the thin-film capacitor was obtained by preparing the thin-film forming composition in the same manner as in the Example 1 except that propylene glycol was added as the stabilizer instead of acetylacetone.

Example 10

As shown in the following table 1, the thin-film capacitor was obtained by preparing the thin-film forming composition in the same manner as in the Example 2 except that 1-amino-2-propanol was added as the stabilizer instead of acetylacetone.

Example 11

As shown in the following table 1, the thin-film capacitor was obtained by preparing the thin-film forming composition in the same manner as in the Example 2 except that copper 2-ethyl butyrate was added as the Cu compound instead of copper naphthenate.

Example 12

As shown in the following table 1, the thin-film capacitor was obtained by preparing the thin-film forming composition in the same manner as in the Example 11 except that formamide was added as the stabilizer instead of acetylacetone and that the baking was performed in a dry air atmosphere.

Example 13

As shown in the following table 1, the thin-film capacitor was obtained by preparing the thin-film forming composition in the same manner as in the Example 12 except that copper nitrate was added as the Cu compound instead of copper 2-ethyl butyrate and that the baking was performed in the oxygen atmosphere.

Example 14

As shown in the following table 1, the thin-film capacitor was obtained by preparing the thin-film forming composition in the same manner as in the Example 8 except that copper naphthenate was added such that the molar ratio B/A between B and A became 0.001.

Example 15

As shown in the following table 1, the thin-film capacitor was obtained by preparing the thin-film forming composition in the same manner as in the Example 8 except that copper naphthenate was added such that the molar ratio B/A between B and A became 0.002.

Example 16

As shown in the following table 1, the thin-film capacitor was obtained by preparing the thin-film forming composition in the same manner as in the Example 8 except that copper naphthenate was added such that the molar ratio B/A between B and A became 0.005.

Example 17

As shown in the following table 1, the thin-film capacitor was obtained by preparing the thin-film forming composition in the same manner as in the Example 8 except that copper naphthenate was added such that the molar ratio B/A between B and A became 0.01.

Example 18

As shown in the following table 1, the thin-film capacitor was obtained by preparing the thin-film forming composition in the same manner as in the Example 1 except that copper n-octanoate was added as the Cu compound instead of copper naphthenate, and copper n-octanoate was added such that the molar ratio B/A between B and A became 0.01.

Example 19

As shown in the following table 1, the thin-film capacitor was obtained by preparing the thin-film forming composition in the same manner as in the Example 18 except that copper 2-ethylhexanoate was added as the Cu compound instead of copper n-octanoate.

Example 20

As shown in the following table 1, the thin-film capacitor was obtained by preparing the thin-film forming composition in the same manner as in the Example 18 except that copper n-valerate was added as the Cu compound instead of copper n-octanoate.

Example 21

As shown in the following table 1, the thin-film capacitor was obtained by preparing the thin-film forming composition in the same manner as in the Example 18 except that copper i-valerate was added as the Cu compound instead of copper n-octanoate.

Example 22

As shown in the following table 1, the thin-film capacitor was obtained by preparing the thin-film forming composition in the same manner as in the Example 18 except that copper n-butyrate was added as the Cu compound instead of copper n-octanoate.

Example 23

As shown in the following table 1, the thin-film capacitor was obtained by preparing the thin-film forming composition in the same manner as in the Example 18 except that copper i-butyrate was added as the Cu compound instead of copper n-octanoate.

Example 24

As shown in the following table 1, the thin-film capacitor was obtained by preparing the thin-film forming composition in the same manner as in the Example 18 except that copper propionate was added as the Cu compound instead of copper n-octanoate.

Example 25

As shown in the following table 1, the thin-film capacitor was obtained by preparing the thin-film forming composition in the same manner as in the Example 18 except that copper acetate was added as the Cu compound instead of copper n-octanoate.

Example 26

As shown in the following table 1, the thin-film capacitor was obtained by preparing the thin-film forming composition in the same manner as in the Example 1 except that copper naphthenate was added such that the molar ratio B/A between B and A became 0.14.

Comparative Example 1

The thin-film capacitor was obtained by preparing the thin-film forming composition in the same manner as in the Example 1 except that the Cu compound was not added.

Comparative Example 2

As shown in the following table 1, the thin-film capacitor was obtained by preparing the thin-film forming composition in the same manner as in the Example 1 except that copper naphthenate was added such that the molar ratio B/A between B and A became 0.0005.

Comparative Example 3

As shown in the following table 1, the thin-film capacitor was obtained by preparing the thin-film forming composition in the same manner as in the Example 1 except that copper naphthenate was added such that the molar ratio B/A between B and A became 0.15.

TABLE 1

| | Dielectric-thin-film forming composition | | | Film forming condition Baking |
|---|---|---|---|---|
| | B/A (molar ratio) | Addition state of raw material B | Stabilizer | atmosphere |
| Example 1 | 0.02 | copper naphthenate | acetylacetone | Air |
| Example 2 | 0.03 | copper naphthenate | acetylacetone | Air |
| Example 3 | 0.05 | copper naphthenate | acetylacetone | Air |
| Example 4 | 0.10 | copper naphthenate | acetylacetone | Air |
| Example 5 | 0.02 | copper naphthenate | diethanolamine | Air |
| Example 6 | 0.02 | copper naphthenate | triethanolamine | Air |
| Example 7 | 0.02 | copper naphthenate | formamide | Air |
| Example 8 | 0.02 | copper naphthenate | 1-amino-2-propanol | Air |
| Example 9 | 0.02 | copper naphthenate | propylene glycol | Air |
| Example 10 | 0.03 | copper naphthenate | 1-amino-2-propanol | Air |
| Example 11 | 0.03 | copper 2-ethyl butyrate | acetylacetone | Air |
| Example 12 | 0.03 | copper 2-ethyl butyrate | formamide | Dry air |
| Example 13 | 0.03 | copper nitrate | formamide | Oxygen |
| Example 14 | 0.001 | copper naphthenate | 1-amino-2-propanol | Air |
| Example 15 | 0.002 | copper naphthenate | 1-amino-2-propanol | Air |
| Example 16 | 0.005 | copper naphthenate | 1-amino-2-propanol | Air |
| Example 17 | 0.01 | copper naphthenate | 1-amino-2-propanol | Air |
| Example 18 | 0.01 | copper n-octanoate | acetylacetone | Air |
| Example 19 | 0.01 | copper 2-ethylhexanoate | acetylacetone | Air |
| Example 20 | 0.01 | copper n-valerate | acetylacetone | Air |
| Example 21 | 0.01 | copper i-valerate | acetylacetone | Air |
| Example 22 | 0.01 | copper n-butyrate | acetylacetone | Air |

TABLE 1-continued

| | Dielectric-thin-film forming composition | | | Film forming condition Baking |
|---|---|---|---|---|
| | B/A (molar ratio) | Addition state of raw material B | Stabilizer | atmosphere |
| Example 23 | 0.01 | copper i-butyrate | acetylacetone | Air |
| Example 24 | 0.01 | copper propionate | acetylacetone | Air |
| Example 25 | 0.01 | copper acetate | acetylacetone | Air |
| Example 26 | 0.14 | copper naphthenate | acetylacetone | Air |
| Comparative Example 1 | — | — | acetylacetone | Air |
| Comparative Example 2 | 0.0005 | copper naphthenate | acetylacetone | Air |
| Comparative Example 3 | 0.15 | copper naphthenate | acetylacetone | Air |

<Comparative Tests and Evaluation Thereof>

The evaluations were made regarding the leak current densities, the tunabilities, and the dielectric constants of the thin-film capacitors which were obtained in Examples 1 to 26 and Comparative Examples 1 to 3. Furthermore, the evaluations was made regarding the storage stability of the composition by the measurement of the particle count in the liquid with respect to each dielectric thin-film forming compositions which were prepared in Examples 1 to 26 and Comparative Examples 1 to 3. The results will be shown in the following table 2.

(1) Leak current density: A DC voltage was applied between the upper electrode of the thin-film capacitor and the Pt lower electrode immediately under the dielectric thin film to evaluate the voltage dependency (I-V characteristic) of the leak current density. The value of the leak current density under the application of the voltage of 20V was set as a representative value. In addition, the I-V characteristic was measured using a current/voltage measurement apparatus (Keithley Instruments Inc., model number: 236 SMU) under conditions of a bias step of 0.5V, a delay time of 0.1 sec, the temperature of 23° C., and a hygrometry of 50±10%.

(2) Tunability: A bias voltage of 20V was applied at 10 MHz between the Pt upper electrode and the Pt lower electrode of the thin-film capacitor to calculate the variation T (%) of the capacitance which can be obtained by the following formula (1) using the capacitance $C_{0V}$ at the time when the bias voltage was not applied and the $C_{20V}$ at the when the bias voltage of 20V was applied. In addition, the variation T (%) of the capacitance was measured using an impedance material analyzer (Hewlett-Packard Company: HP4291A).

$$T=(C_{0V}-C_{20V})/C_{0V}\times 100 \quad (1)$$

(3) dielectric constant: A bias voltage of 0V was applied at 10 MHz between the Pt upper electrode and the Pt lower electrode of the thin-film capacitor with a thickness of d and with an area of S to calculate the dielectric constants by the following formula (2) using the capacitance $C_{0V}$. The value of $8.854\times 10^{-12}$ (F/m) was used as the dielectric constant in the vacuum state. In addition, the capacitance $C_{0V}$ was measured using the impedance material analyzer (Hewlett-Packard Company: HP4291A).

$$\in = C_{0V}\times d/S/8.854\times 10^{-12} \quad (2)$$

(4) Storage Stability: Each prepared dielectric thin film-forming composition was filtered using a membrane filter (Nihon Entegris, pore diameter: 0.05 μm) and a pressure tank, and the composition was transferred to a washed glass screw-top bottle (Wakayama CIC Research Laboratory Washed Product) and stored for 2 months while being held at a temperature of 7° C. The number of particles (number of particles/ml) having a particle diameter of 0.5 μm or more in the liquid was respectively confirmed with a particle counter (Rion, KS-42B) for the compositions immediately after filtering (after allowing to stand undisturbed for 2 hours) and the compositions after storing for 2 months. Furthermore, compositions were evaluated in Table 2 as "OK" if the number of particles in the liquid contained in the compositions after storage was less than 50 particles/ml, and "NG" if the number of particles exceeded 50 particles/ml.

TABLE 2

| | Evaluation | | | | | |
|---|---|---|---|---|---|---|
| | Thin-Film Capacitor | | | Composition for Forming Dielectric-Thin-Film | | |
| | | | | Particle count (number of particles/ml) | | |
| | Leak current density (A/cm²) | Tunability (%) | Dielectric constant | Immediately after | After storage | Storage stability |
| Example 1 | $1.0\times 10^{-6}$ | 82 | 520 | 18 | 20 | OK |
| Example 2 | $6.1\times 10^{-7}$ | 78 | 400 | 22 | 25 | OK |
| Example 3 | $2.2\times 10^{-7}$ | 75 | 360 | 17 | 21 | OK |
| Example 4 | $1.9\times 10^{-7}$ | 73 | 340 | 16 | 20 | OK |
| Example 5 | $1.8\times 10^{-6}$ | 78 | 420 | 15 | 18 | OK |

TABLE 2-continued

| | Evaluation | | | | | |
|---|---|---|---|---|---|---|
| | Thin-Film Capacitor | | | Composition for Forming Dielectric-Thin-Film | | |
| | | | | Particle count (number of particles/ml) | | |
| | Leak current density ($A/cm^2$) | Tunability (%) | Dielectric constant | Immediately after | After storage | Storage stability |
| Example 6 | $2.0 \times 10^{-6}$ | 80 | 480 | 17 | 20 | OK |
| Example 7 | $2.2 \times 10^{-6}$ | 80 | 470 | 20 | 20 | OK |
| Example 8 | $1.2 \times 10^{-6}$ | 82 | 500 | 16 | 24 | OK |
| Example 9 | $1.6 \times 10^{-6}$ | 79 | 450 | 23 | 33 | OK |
| Example 10 | $5.5 \times 10^{-7}$ | 76 | 380 | 19 | 20 | OK |
| Example 11 | $6.2 \times 10^{-7}$ | 75 | 380 | 25 | 29 | OK |
| Example 12 | $7.4 \times 10^{-7}$ | 77 | 400 | 24 | 27 | OK |
| Example 13 | $3.7 \times 10^{-7}$ | 75 | 370 | 32 | 46 | OK |
| Example 14 | $2.9 \times 10^{-6}$ | 72 | 300 | 13 | 16 | OK |
| Example 15 | $2.5 \times 10^{-6}$ | 73 | 330 | 15 | 18 | OK |
| Example 16 | $2.2 \times 10^{-6}$ | 75 | 350 | 15 | 19 | OK |
| Example 17 | $1.4 \times 10^{-6}$ | 77 | 380 | 14 | 17 | OK |
| Example 18 | $1.5 \times 10^{-6}$ | 77 | 380 | 23 | 30 | OK |
| Example 19 | $1.6 \times 10^{-6}$ | 75 | 350 | 18 | 25 | OK |
| Example 20 | $1.3 \times 10^{-6}$ | 78 | 380 | 25 | 29 | OK |
| Example 21 | $1.4 \times 10^{-6}$ | 76 | 360 | 24 | 32 | OK |
| Example 22 | $1.2 \times 10^{-6}$ | 78 | 390 | 26 | 31 | OK |
| Example 23 | $1.4 \times 10^{-6}$ | 78 | 380 | 32 | 44 | OK |
| Example 24 | $1.4 \times 10^{-6}$ | 77 | 370 | 30 | 47 | OK |
| Example 25 | $1.2 \times 10^{-6}$ | 78 | 400 | 41 | 780 | NG |
| Example 26 | $2.0 \times 10^{-7}$ | 72 | 330 | 20 | 25 | OK |
| Comparative Example 1 | $8.8 \times 10^{-6}$ | 71 | 250 | 14 | 18 | OK |
| Comparative Example 2 | $7.1 \times 10^{-6}$ | 71 | 250 | 16 | 22 | OK |
| Comparative Example 3 | $3.3 \times 10^{-7}$ | 69 | 320 | 22 | 27 | OK |

As can be understood from Table 1 and Table 2, sufficiently excellent results were obtained in the evaluation regarding the leak current density, the tunability, and the dielectric constant in Examples 1 to 26 as compared with Comparative Example 1.

It was also observed from the comparison of Examples 1 to 26 with Comparative Example 2 that the thin-film capacitor in Comparative Example 2, of which the B/A was less than 0.001 exhibited the same dielectric constant as that in Comparative Example 1 in which copper was not added, and that there was substantially no effect by the addition of the copper. In addition, it was also observed from the comparison of Examples 1 to 26 with Comparative Example 3 that the tunability in the thin-film capacitor in Comparative Example 3, of which the B/A was not less than 0.15, was significantly lowered.

In addition, in the compositions for forming a dielectric thin film of Example 25, which were prepared using copper acetate, for the raw material of the composite oxide B, a considerable increase in the number of particles in the liquid was confirmed after storing for 2 months, thus indicating poor storage stability. In contrast, in those compositions for forming a dielectric thin film that were prepared using a raw material other than copper acetate for the raw material of the composite oxide B, there were few particles in the liquid after storing for 2 months, thus confirming these compositions to have excellent storage stability.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A dielectric-thin-film forming composition for forming a BST dielectric thin film, comprising:
   a liquid composition for forming a thin film which takes a form of a mixed composite metal oxide in which a composite oxide B including Cu (copper) is mixed into a composite metal oxide A expressed by a formula: $Ba_{1-x}Sr_xTi_yO_3$ (wherein $0.2<x<0.6$ and $0.9<y<1.1$),
   wherein the liquid composition is an organic metal compound solution in which raw materials for composing the composite metal oxide A and raw materials for composing the composite oxide B are dissolved in an organic solvent at a proportion of giving a metal atom ratio expressed by the formula shown above and at a molar ratio between A and B in the range of $0.001 \leq B/A < 0.15$,
   the raw materials for composing the composite metal oxide A are organic metal compounds, wherein one of the raw materials for comprising the composite metal oxide A is a compound in which an organic group is bonded to the respective metallic elements of Ba, Sr, and Ti via an oxygen atom or a nitrogen atom thereof, and the raw materials for composing the composite oxide B are organic metal compounds, wherein one of the raw materials for composing the composite oxide B is at least one compound selected from a group consisting of copper naphthenate, copper n-octanoate, copper 2-ethylbutyrate, copper n-valerate, copper i-valerate, copper n-butyrate, copper i-butyrate, copper propionate, and copper acetate.

2. The dielectric-thin-film forming composition according to claim 1,
wherein one of the raw materials for composing the composite metal oxide A is at least one compound selected from a group including a metal alkoxide, a metal-diol complex, a metal-triol complex, a metal carboxylate, a metal β-diketonate complex, a metal β-diketo esters complex, a metal β-iminoketo complex, and a metal amino complex.

3. The dielectric-thin-film forming composition according to claim 1, further comprising:
at least one stabilizer selected from a group including β-diketone, β-ketone acid, β-ketoester, an oxyacid, a diol, a triol, a higher carboxylate, alkanolamine, and polyvalent amine at a ratio of 0.2 to 3 mol with respect to 1 mol of the total amount of the metal in the composition.

4. The dielectric-thin-film forming composition according to claim 1, wherein the molar ratio B/A between B and A is in the range of 0.002≤B/A≤0.1.

5. A method of forming a dielectric thin film, comprising the steps of:
repeating a process for coating a heat-resistant substrate with the dielectric-thin-film forming composition according to claim 1 and drying it, until a film with a desirable thickness is obtained;
baking, after the above process, the film at its crystallization temperature or higher in an air, an oxygen atmosphere, or a water vapor atmosphere.

6. The dielectric-thin-film forming composition according to claim 1, wherein the organic metal compound solution consists of 0.1 to 20 percent by mass of the organic metal compounds in terms of the metal oxide.

7. The dielectric-thin-film forming composition according to claim 1, wherein the organic solvent is at least one solvent selected from a group consisting of acetone, methyl ethyl ketone, dimethyl ether, diethyl ether, cyclohexane, cyclohexanol, benzene, toluene, xylene, tetrahydrofuran, n-butyric acid, α-methylbutyrate, i-valeric acid, 2-ethyl butyrate, 2,2-dimethyl butyrate, 3,3-dimethyl butyrate, 2,3-dimethyl butyrate, 3-methylpentane acid, 4-methylpentane acid, 2-ethylpentane acid, 3-ethylpentane acid, 2,2-dimethylpentane acid, 3,3-dimethylpentane acid, 2,3-dimethylpentane acid, 2-ethylhexanoatane acid, 3-ethylhexane acid, ethyl acetate, propyl acetate, n-butyl acetate, sec-butyl acetate, tert-butyl acetate, isobutyl acetate, n-amyl acetate, sec-amyl acetate, tert-amyl acetate, isoamyl acetate, 1-propanol, 2-propanol, 1-butanol, 2-butanol, iso-butyl alcohol, 1-pentanol, 2-pentanol, 2-methyl-2-pentanol, and 2-methoxyethanol.

8. The dielectric-thin-film forming composition according to claim 1, wherein the raw materials for comprising the composite metal oxide A is at least one compound selected from a group consisting of barium 2-ethylbutyrate, barium acetate, barium diisopropoxide, and barium dibutoxide.

9. The dielectric-thin-film forming composition according to claim 1, wherein the raw materials for comprising the composite metal oxide A is at least one compound selected from a group consisting of strontium 2-ethylbutyrate, strontium acetate, strontium diisopropoxide, and strontium dibutoxide.

10. The dielectric-thin-film forming composition according to claim 1, wherein the raw materials for comprising the composite metal oxide A is at least one compound selected from a group consisting of titanium tetraethoxide, and titanium dimethoxy-diisopropoxide.

* * * * *